Feb. 13, 1962 R. JIU 3,021,450

RING COUNTER

Filed April 7, 1960 2 Sheets-Sheet 1

RICHARD JIU
INVENTOR.

BY Arthur Decker
Morris Spector
ATTORNEY

RICHARD JIU
INVENTOR.

BY Archer Decker
Morris Spector
ATTORNEYS

United States Patent Office 3,021,450
Patented Feb. 13, 1962

3,021,450
RING COUNTER

Richard Jiu, San Pedro, Calif., assignor to Thompson Ramo Wooldridge Inc., Canoga Park, Calif., a corporation of Ohio Filed Apr. 7, 1960, Ser. No. 20,744
12 Claims. (Cl. 315—84.5)

Figure 1:
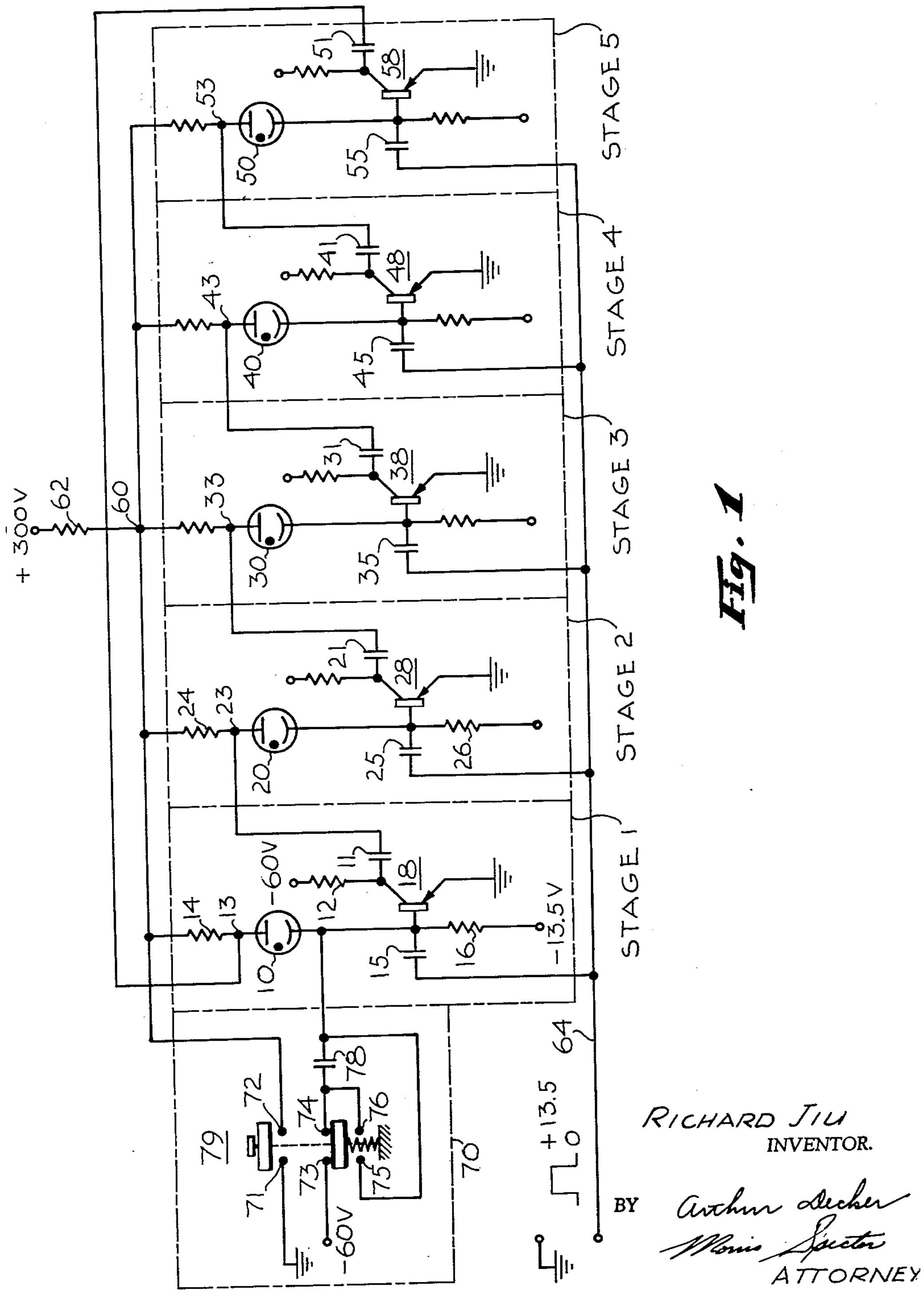

This invention relates to electronic counting circuits and more particularly to ring counters employing gas-filled diodes, or equivalent devices, as bistable state elements.

Electronic counters, especially those in digital computers, employ a large number of bistable state circuits, usually flip-flops. Flip-flops are in general quite expensive, and as a result, lower cost bistable state circuits are constantly being sought. Bistable state circuits employing elements such as gas-filled diodes have been found especially suited for use in counters and frequency dividers where relatively simple gating is required. Gas-filled diodes are usually filled with nitrogen, neon, argon, or mercury vapor, and exhibit a characteristic curve having a negative resistance region bounded by two positive resistance regions. The series combination of an impedance and a gas-filled diode provides a simple, reliable circuit, which takes advantage of the two positive resistance regions to provide bistable characteristics. The diode may be switched to a stable high current state by exceeding the ionization potential of the gas and then switched to a stable low current state by dropping the voltage below the de-ionization potential. In the high current state, the diode exhibits a very low impedance and, in the low (i.e., zero) current state, exhibits essentially infinite impedance.

One example of the use of gas-filled diodes is in a ring counter which has a plurality of stages each including a diode in series with a resistor. The stages are connected in cascade with a capacitor coupling an output of one stage to the input of the next. All stages are connected in parallel across a source of potential. Assuming that one stage is in a high current state, to transfer this state to the next stage, the potential of the source is dropped below the de-ionization potential of its diode long enough to cut off current flow, and then raised back up. The stored charge of the coupling capacitor on the output of the stage priorly conducting effects a high current state in the next stage in the cascade as the potential is raised.

Although ring counters such as the one described are relatively inexpensive compared with counters employing flip-flops, they are not considered particularly reliable, are capable only of low repetition rates, and require special circuitry to raise and lower power supply voltage.

To overcome such disadvantages, the present invention provides an improved counter having a plurality of stages connected in cascade, each stage comprising, in the preferred embodiment, a neon-filled diode and a load resistor which form a bistable state circuit, an input capacitor and bias resistor which form an input circuit, and a transistor switching circuit and output capacitor which form an output circuit. Assuming, initially, that a diode in one stage is in a state of high current conduction and that it is desired to change the state of the counter, an input pulse is applied to the input circuits of all stages. The output circuits are responsive to the leading edge of the input pulse to develop a de-ionization signal for the diode in the conducting stage. When current in the conducting diode cuts off, the associated output circuit develops an ionization signal for the diode of a succeeding stage.

Accordingly, one object of the present invention is to provide a ring counter, employing gas-filled diodes as bistable elements, with a higher counting rate than previously available.

Another object is to provide a ring counter, employing gas-filled diodes as bistable elements, which counts pulses with greatly improved reliability.

Still another object is to provide an improved counter, which may be easily and inexpensively adapted for use in a digital computer in synchronization with other components of the computer.

Figure 2:
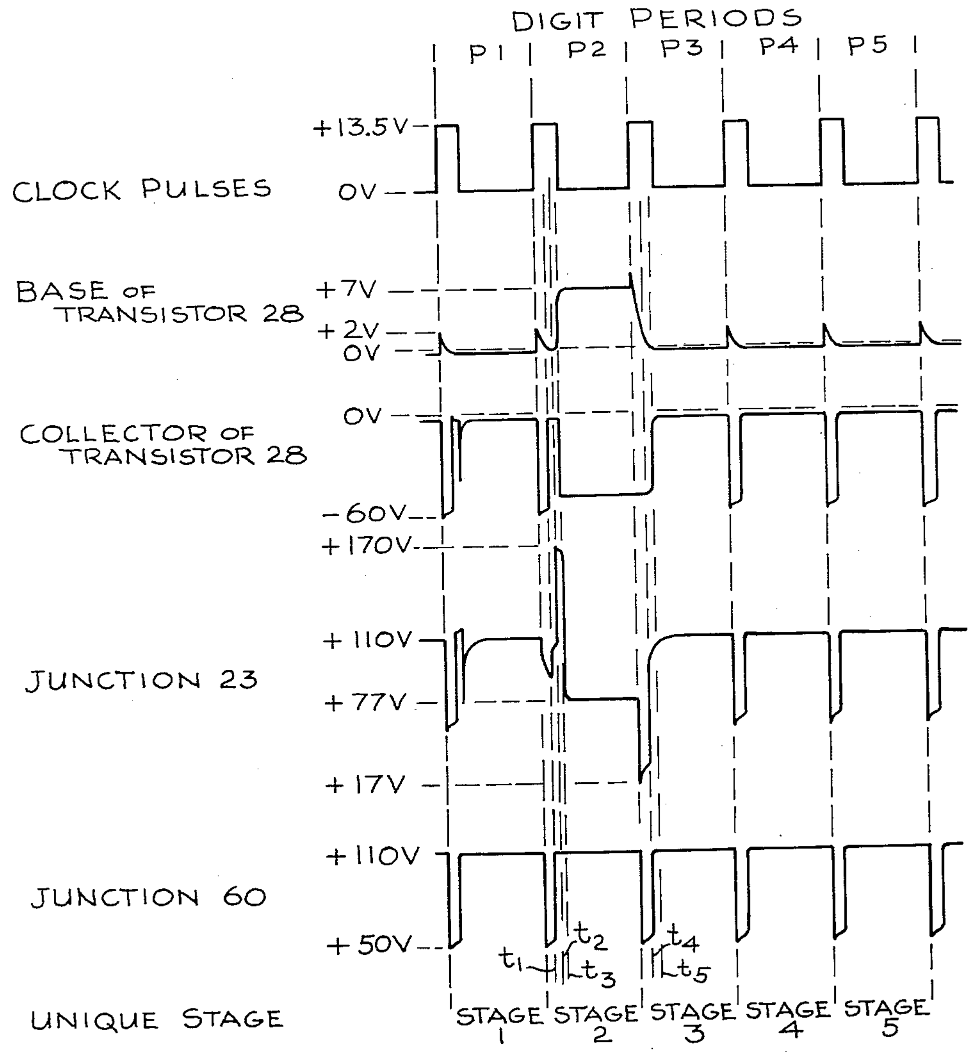

Other objects and attendant advantages of this invention will become evident to those skilled in the art by reference to the following detailed description of the accompanying figures in which, FIGURE 1 is a 5-stage ring counter according to the invention, using gas-filled diodes as bistable elements; and FIGURE 2 is a waveshape graph of the signals at designated points in the ring counter of FIGURE 1.

Referring to FIGURE 1, the schematic diagram, according to the invention, of a ring counter of typically 5 stages, the stages of the counter are designated by dashed line as stage 1 through stage 5 and are identical bistable circuits, except that provision for resetting the counter is associated with stage 1. In stage 1, a serial combination of load resistor 14, neon-filled diode 10 and bias resistor 16 is connected between a −13.5 volt supply, and junction 60. Junction 60 is at one end of voltage dropping resistor 62, the other end of which is connected to a +300 volt supply. At the junction of diode 10 and resistor 16 is connected the base of PNP transistor 18, which receives an input signal (the pulses to be counted) from line 64 through input capacitor 15. The emitter of transistor 18 is grounded and the collector thereof is biased by a −60 volt supply through resistor 12. Output from stage 1 is taken at the collector of transistor 18 through capacitor 11 which connects to junction 23, thereby providing a facility for signal transfer to succeeding stages in the counter. A ring is formed by an identical connection between capacitor 51 of stage 5 and junction 13. As indicated, the other stages of the counter are identical to stage 1 in the above particulars.

In order that the counter may be reset to a particular state prior to counting input pulses, there is provided in association with one of the stages, here stage 1, reset circuit 70. Reset circuit 70 includes switch 79 which, when activated, sets stage 1 to a predetermined one of the bistable states which it is capable of assuming, and simultaneously sets stages 2 through 5 to the other bistable state. Switch 79 is a 2-pole double-throw unit, in which contact 71 is grounded, contact 72 connects to junction 60, contact 73 connects to the −60 volts supply, and contacts 74 and 76 both connect to one side of counter reset capacitor 78, the other side of which connects to contact 75 and the base of transistor 18 of stage 1. As indicated, switch 79 is constructed such that contacts 71 and 72, contacts 73 and 74, and contacts 75 and 76 are operatively paired, the first and third pairs being normally open and the second pair being normally closed, the normal condition being defined as that for which switch 79 is not activated. Thus, in the inactivated position shown, switch 79 connects the base of transistor 18 (through capacitor 78) to −60 volts via contacts 74 and 73. In the activated position, switch 79 connects junction 60 to ground via contacts 72 and 71 and connects a short circuit across capacitor 78 via contacts 75 and 76.

Before discussing the operation of the circuit of FIGURE 1, it may be remarked that circuits embodying the invention may be used in electronic equipment, such as a digital computer, which provides a source of basic timing pulses. These timing pulses are positive-going, rectangular, of constant repetition rate, and are generally referred to as clock pulses, since the time interval between their leading edges establishes the computer digit period (the time provided for elemental operations). Although the invention is not limited thereto, it will be applied as a counter for clock pulses, establishing 5 sequential digit periods, designated as P1 through P5, and which are supplied to the counter on line 64 and are +13.5 v. in amplitude. Furthermore, it may be pointed out that the characteristics of the diodes and transistors in the counter stages and the values of the associated resistors are such that, when the diode is conductive, the transistor is cut off, and vice versa. Thus, assuming, initially, that the counter is in the condition whereby stage 1 is in the unique state, only diode 10 is conductive and only transistor 18 is cut off. Assuming further that the diodes have ionization potentials of about 135 volts, operating potentials of about 70 volts, and de-ionization potentials of about 50 volts, and the voltage supplies are valued as shown in FIGURE 1, the following is the distribution of approximate potentials with respect to ground (zero potential): at junction 60, +110 v.; at junction 13, +77 v.; at the base of transistor 18, +7 v.; at the collector of transistor 18, −60 v.; at junctions 23, 33, 43 and 53, +110 v.; at the bases and collectors of transistors 28, 38, 48 and 58, 0 v. It follows that the voltage impressed across diodes 20, 30, 40 and 50 is less than their ionization potential; therefore, these diodes cut off and transistors 28, 38, 48 and 58 remain conductive. The counter may be considered as storing a count in stage 1 during digit period P1.

The leading edges of the succeeding four clock pulses, in digit periods P2 through P5, cause a transfer of the count to stages 2, 3, 4 and 5, respectively, in similar fashion; therefore, only a transfer through stage 2 will be detailed.

Referring now to FIGURE 2 and digit period P1 thereof, stage 1 is indicated to be unique and the potentials of selected points in the counter (FIGURE 1) are indicated as above stated. The leading edge of the clock pulse in period P2 is coupled through capacitors 15, 25, 35, 45 and 55 to the bases of transistors 18, 28, 38, 48 and 58, causing their potentials to rise. This has no effect on transistor 18, which is already reverse-biased and cut off; however, the rise on the base of transistors 28, 38, 48 and 58 is to about +2 v. and these transistors are cut off. The potential of the collectors of these transistors drop from essentially 0 volt to −60 volts. This drop is coupled through capacitors 21, 31, 41 and 51 to junctions 33, 43, 53 and 13. The potential of junction 60 drops to about +50 v., then rises slightly because capacitors 21, 31, 41 and 51 start charging. The potential of junction 13 reduces to about +17 v.; therefore, the potential across diode 10 is less than its de-ionization potential, and the diode starts to de-ionize. Because of the drop in potential of junction 60, capacitor 11 starts to discharge which causes the potential of junction 23 to start falling and the potential of the collector transistor 28 to rise. However, input capacitor 25 charges rapidly through resistor 26 and at time $t1$ the potential of the base of transistor 28 is below 0 volt, this transistor conducts and its collector voltage rises from −60 volts to 0 volt (neglecting the emitter-to-collector voltage drop). The rise in potential is coupled through capacitor 21 to junction 33. Diode 10 continues to de-ionize, and the potential of the base of transistor 18 drops. At time $t2$, the potential drops below 0 volt, transistor 18 conducts and the collector potential rises from −60 volts to 0 volt, the rise being coupled to junction 23 by capacitor 11. During the quiescent period prior to the clock pulse in P2, capacitor 11 is charged to 170 volts (−60 volts on the collector of transistor 118 and +110 volts at junction 23), therefore, the potential at junction 23 rises to 170 volts. Since the potential across diode 23 exceeds its ionization potential, it begins to conduct. At time $t3$ the potential at the base of transistor 28 rises above 0 volt, transistor 28 is cut off and its collector potential drops to −60 volts. Shortly after time $t3$, diode 20 is fully ionized, the potential on the base of transistor 28 is +7 volts and the potential at junction 23 drops from 170 volts to +77 volts.

The leading edge of the clock pulse in period P3 is coupled through capacitors 15 and 25 to the bases of transistors 18 and 28, respectively, causing their potentials to rise. This causes transistor 18 to cut off; however, transistor 28 is already cut off and the rise has no effect on it. The potential at the collector of transistor 18 drops to −60 volts, and capacitor 11 couples the drop to junction 23. The potential of junction 23 reduces to about +17 volts; therefore, the potential across diode 20 is less than its de-ionization potential and it starts to de-ionize. As the current through diode 20 starts to decrease, the potential at junction 23 starts rising and the potential at the base of transistor 28 starts falling. A 60 volt drop in potential is also coupled by capacitors 31, 41 and 51 to junctions 43, 53 and 13, and the potential at junction 60 drops to about +50 volts. Capacitor 15 charges rapidly through resistor 16 and at time $t4$ the potential at the base of transistor 18 is below 0 volt, transistor 18 conducts, and its collector voltage rises from −60 volts to 0 volt. This rise is coupled through capacitor 11 to junction 23. Similarly a rise in potential is coupled to junctions 43 and 53 and the potential at junction 60 rises to +110 volts. The potential at junction 23 does not rise to +110 volts immediately but approaches 110 volts exponentially as capacitor 11 charges through resistors 24 and 12. At time $t5$ the base of transistor 28 drops below 0 volt, transistor 28 starts conducting and the collector potential rises to 0 volt. The rise in potential is coupled to diode 30 which ionizes.

In summary, on incidence of two clock pulses, the count formerly contained in stage 1 of the counter has been shifted to stage 3. To reset the counter, so that stage 1 is the unique stage, switch 79 is activated, connecting junction 60 to ground, thereby de-ionizing any conducting diode. Switch 70 is then de-activated connecting the base of transistor 18 to −60 volts and ionizing diode 10. Capacitor 78 is also short circuited and discharged. Since capacitor 78 was previously completely discharged, maximum ionization potential is insured across diode 10.

From the foregoing description it should be apparent that the present invention provides a simple, reliable and inexpensive counting or frequency divider circuit, utilizing a simple two-state, two-terminal device such as a gas-filled diode. Output signals may be derived from either terminal of the diode, or, if amplification is desired, at the collector of the transistor in each circuit. Output signals may be used to energize any of the well-known types of indicators, such as a "Nixie" numerical readout tube, or the state of the circuit may be observed visually since a glow is on the negative cathode of the conductive diode.

While the invention has been described as a counter with five stages, stages may be added or removed without departing from the invention. Further, the invention is not limited to the use of PNP transistors since, with proper design changes, NPN transistors or other three-terminal devices may be used and will provide the same switching characteristics. Also, bistable elements, exhibiting a characteristic other than that of gas-filled diodes, may be substituted for the gas-filled diodes exemplified, without departing from the scope of this invention. It should further be obvious that the counter may be made to count negative input pulses by reversing the polarity of the power supply voltages and using NPN transistors. Such substitution of elements and rearrangement of the appended figure may be made without the sacrifice of reliability or advantages already pointed out and is contemplated to be within the scope of the following claims.

What is claimed is:

1. A counter having a plurality of stages connected in cascade, each stage comprising: a load impedance, a gas-filled diode and a bias impedance connected across a source of potential; a transistor comprising a base electrode connected to the junction of said gas-filled diode and bias impedance, an emitter electrode connected to a reference potential, and a collector electrode; a source of pulses; an input capacitor for coupling said source of pulses to the base electrode of said transistor; and a coupling capacitor connected between the collector electrode of said transistor and the junction of the load impedance and gas-filled diode in the succeeding stage.

2. The counter of claim 1 and a voltage dropping impedance connected between the source of potential and the load impedance in each stage, wherein the values of said voltage dropping, load and bias impedances are such that when one gas-filled diode is ionized, the potential across all other gas-filled diodes is below the ionization potential.

3. The counter of claim 1 wherein the discharge time of said input capacitor is shorter than the discharge time of said gas-filled diode and the discharge time of said coupling capacitor is longer than the discharge time of said gas-filled diode.

4. The counter of claim 1 having a first stage and a last stage in the cascade wherein all stages are identical and connected to form a ring counter.

5. The counter of claim 1 including a reset circuit comprising means to develop a de-ionization potential across each said gas-filled diode, and then to develop an ionizing potential across only one of said gas-filled diodes.

6. A ring counter including a plurality of stages having an input line connected to each stage, each of said stages comprising: a bistable gas-filled diode defining a first stable ionized state and a second stable de-ionized state; circuit means for generating a de-ionization signal in response to an input pulse and an ionization signal in response to a change of said diode from said first to said second state; and means coupling said de-ionization and ionization signals to a succeeding stage.

7. A ring counter including a plurality of stages having an input line connected to each stage, each of said stages comprising: a bistable gas-filled diode defining a first stable ionized state and a second stable de-ionized state; first circuit means for generating a first control signal in response to an input pulse on said input line and a second control signal in response to a change of said diode from said first to said second state; second circuit means responsive to said first and second control signals, respectively, for providing de-ionization and ionization signals; and third circuit means coupling said de-ionization and ionization signals to a succeeding stage.

8. The combination of claim 7 wherein said second circuit means comprises a transistor including a base, a collector, and an emitter, and means coupling said first and second control signals to said base for biasing said transistor.

9. The combination of claim 8 wherein said collector is connected through a resistor to a fixed voltage level, said third circuit means comprising a capacitor connected between said collector and one terminal of the diode of said succeeding stage.

10. The combination of claim 7 wherein said second circuit means comprises a transistor including a base, a collector, and an emitter, and means coupling said first and second control signals to said base for respectively off-biasing and forward-biasing said transistor, said collector connected through a resistor to a fixed negative voltage level; said emitter connected directly to ground, said third circuit means comprising a capacitor connected between said collector and a first terminal of the diode of said succeeding stage for coupling potential changes of said collector thereto, said collector potential changes constituting said de-ionization and said ionization signals.

11. The combination of claim 8 wherein said first circuit means includes a timing circuit connection between said input line and said base, said timing circuit having a smaller time constant than the current decay time of said gas-filled diode.

12. The combination of claim 11 wherein said timing circuit comprises a capacitor.

References Cited in the file of this patent

UNITED STATES PATENTS

| | | |
|---|---|---|
| 2,730,655 | Geisler | Jan. 10, 1956 |
| 2,809,292 | Shaw | Oct. 8, 1957 |
| 2,851,220 | Kimes | Sept. 9, 1958 |
| 2,924,747 | Fierston | Feb. 9, 1960 |

FOREIGN PATENTS

| | | |
|---|---|---|
| 632,168 | Great Britain | Nov. 17, 1949 |
| 162,398 | Australia | Apr. 7, 1955 |

UNITED STATES PATENT OFFICE
CERTIFICATE OF CORRECTION

Patent No. 3,021,450 February 13, 1962

Richard Jiu

It is hereby certified that error appears in the above numbered patent requiring correction and that the said Letters Patent should read as corrected below.

Column 3, line 68, for "118" read -- 18 --; column 6, line 27, for "connection" read -- connected --.

Signed and sealed this 21st day of August 1962.

(SEAL)
Attest:

ESTON G. JOHNSON
Attesting Officer

DAVID L. LADD
Commissioner of Patents